United States Patent
Spisak et al.

(10) Patent No.: US 6,640,273 B1
(45) Date of Patent: Oct. 28, 2003

(54) APPARATUS FOR DATA BUS EXPANSION BETWEEN TWO INSTRUMENT CHASSIS

(75) Inventors: Kevin C. Spisak, Beaverton, OR (US); Michael S. Hagen, Vancouver, WA (US)

(73) Assignee: Tektronix, Inc., Beaverton, OR (US)

( * ) Notice: Subject to any disclaimer, the term of this patent is extended or adjusted under 35 U.S.C. 154(b) by 468 days.

(21) Appl. No.: 09/741,572

(22) Filed: Dec. 19, 2000

Related U.S. Application Data

(60) Provisional application No. 60/174,636, filed on Jan. 5, 2000.

(51) Int. Cl.[7] ............................. G06F 13/00; H05K 1/11
(52) U.S. Cl. ....................... 710/104; 710/301; 710/305; 710/10; 710/16; 361/796; 361/803; 361/810
(58) Field of Search ......................... 710/100, 300–304, 710/305, 104, 31, 8–19; 361/784–796, 803–810

(56) References Cited

U.S. PATENT DOCUMENTS

| | | | |
|---|---|---|---|
| 4,635,192 A | 1/1987 | Ceccon | |
| 5,119,498 A | 6/1992 | McNeill | |
| 5,189,598 A | 2/1993 | Bolan | |
| 5,274,767 A | * 12/1993 | Maskovyak | 710/16 |
| 5,572,688 A | 11/1996 | Sytwn | |
| 5,737,542 A | * 4/1998 | Kurihara et al. | 710/301 |
| 5,867,382 A | * 2/1999 | McLaughlin | 700/17 |
| 5,974,476 A | 10/1999 | Lin | |
| 5,995,376 A | 11/1999 | Schultz | |
| 6,263,387 B1 | * 7/2001 | Chrabaszcz | 710/302 |
| 6,286,066 B1 | * 9/2001 | Hayes et al. | 710/302 |
| 6,310,992 B1 | * 10/2001 | Gehrke et al. | 385/24 |

FOREIGN PATENT DOCUMENTS

EP     0 403 117     5/1990

OTHER PUBLICATIONS

VMEbus Extensions for Instrumentation, *VXI Bus*, Jul. 17, 1995 VXI, Rev.1.0, VXI–11.1, Rev. 1.0, VXI–11.2, Rev. 1.0, VXI–11.3, Rev. 1.0.

* cited by examiner

*Primary Examiner*—Sumati Lefkowitz
(74) *Attorney, Agent, or Firm*—Thomas F. Lenihan

(57) ABSTRACT

Apparatus for data bus expansion between two instrument chassis comprises a first interface circuit, a connecting cable, and a second interface circuit. Detection circuitry in each interface circuit detects slot position. Slot position determines direction of address and data flow for each card. One of the first and second interface circuits is connected to a controller slot in a first chassis, and the other of the first and second interface circuits is connected to a non-controller slot in a second chassis. Bus interface circuitry for signal and identification are reconfigured in accordance with slot determination. As a result, the assembly formed by connection of two substantially identical interface cards with a cable, is symmetric and reversible.

6 Claims, 3 Drawing Sheets

APPARATUS FOR DATA BUS EXPANSION BETWEEN TWO INSTRUMENT CHASSIS

This application claims benefit of Provisional Ser. No. 60/174,636 filed Jan. 5, 2000.

FIELD OF THE INVENTION

The subject invention generally concerns the field of data buses in test and measurement instruments and specifically concerns data bus expansion between two test and measurement instrument chassis.

BACKGROUND OF THE INVENTION

Modern test and measurement instruments have the capability of monitoring a plurality of channels simultaneously. For example, when a TLA 720 Logic Analyzer, manufactured by Tektronix, Inc., Beaverton, Oreg., is equipped to capacity with five 136-channel modules, it is capable of monitoring up to 680 channels. When it is desirable to monitor even more channels, one must employ an expansion chassis to house additional data acquisition cards.

In order to utilize such an expansion chassis, it is necessary to couple address lines and data lines between a primary (or master) unit and an expansion (or slave) unit. Data flow on the data lines is from the master unit to the expansion unit during data-write operations, and from the expansion unit to the master unit during data-read operations. That is, one must provide an address driver and data receiver/driver interface board at the primary unit and an address receiver and data receiver/driver interface board at the expansion unit, and then one must connect the two interface boards with one or more cables containing hundreds of wires.

This arrangement gives rise to several problems. First, from the user's point of view, one must take care that the two interface boards are not mistakenly inserted into the wrong chassis. Placing a primary side address driver interface board into an expansion unit will, at the very least, cause improper operation of the system, if not damage to the system. Second, some systems (notably VXI bus) require a controller card to occupy slot 0, and driven cards to occupy slots other than 0. Different circuitry must be provided on slot 0 cards (with respect to non-slot 0 cards) to properly interface with the VXI bus system. Thus, from the manufacturers point of view, it is necessary to design, build, stock, and ship two different interface boards.

What is needed is a symmetric and reversible cable and circuit board arrangement that detects its role as a primary-side card or a secondary-side card, and operates correctly in either orientation.

SUMMARY OF THE INVENTION

Apparatus for data bus expansion between two instrument chassis comprises a first interface circuit, a connecting cable, and a second interface circuit. Detection circuitry in each interface circuit detects slot position. Slot position determines direction of address and data flow for each card. One of said first and second interface circuits is connected to a controller slot in a first chassis, and the other of said first and second interface circuits is connected to a non-controller slot in a second chassis. Bus interface circuitry for signal and identification are reconfigured in accordance with slot determination.

DETAILED DESCRIPTION OF THE DRAWING

For purposes of ease of explanation, the invention will be described in the environment of a simplified VXI system. However, one skilled in the art will recognize that the invention is not limited to that environment alone.

Figure 1:
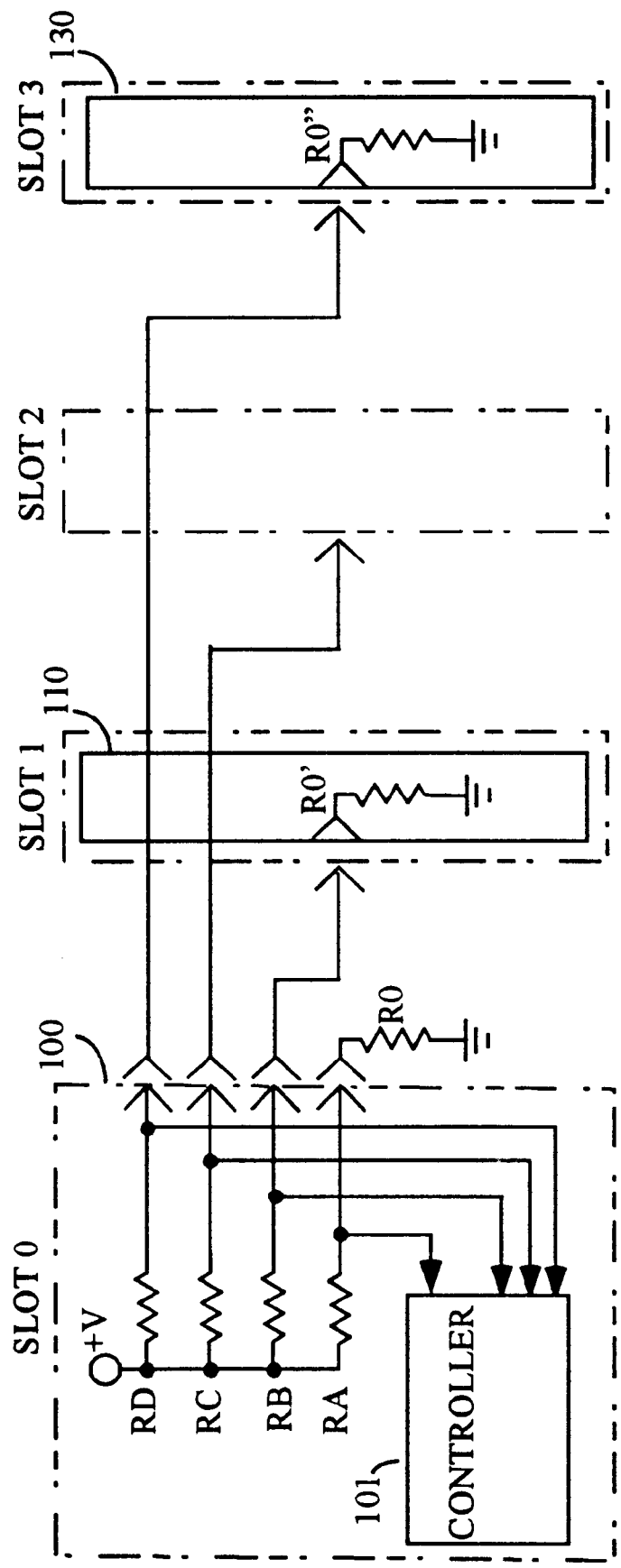
FIG. 1 shows a portion of a VXI backplane in accordance with the prior art.

Refer to prior art FIG. 1 for a brief explanation of the roles of the slots in the VXI system. The VXI standard reserves slot 0 in each chassis for a Controller Card 100. Detection circuitry on Controller Card 100 comprises a pull-up resistor RA and a Controller 101, and is used determine if Controller Card 100 is actually installed in slot 0. FIG. 1 shows four backplane slots, numbered 0 through 3 respectively. Slots 0, 1, and 3, have circuit cards installed, while slot 2 is empty. The backplane wiring of slot 0 is different from that of the other slots because, as noted above, slot 0 is reserved for a controller card. A first difference is that slot 0 has a card-detection connector pin that is hardwired to ground through a pull-down resistor R0 soldered to the backplane of the chassis. Note also that each of the other slots has a corresponding card-detection connector pin that is hardwired back to a respective output pin of slot 0. When Controller Card 100 is plugged into slot 0, all of the four illustrated output connection pins are coupled to a positive voltage via a respective pull-up resistor RA, RB, RC, RD mounted on Controller Card 100.

The first task is for Controller 101 to determine if Controller Card 100 is actually plugged into slot 0, as it should be. If Controller Card 100 is plugged into slot 0, then backplane pull-down resistor R0 and its respective internal pull-up resistor RA form a voltage divider. A low logic level signal is produced at the junction resistors R0 and RA, and is coupled to Controller 101 for voltage level sensing. Testing for a low logic level signal at the junction point of the voltage divider is a definitive test for slot 0 placement because, as noted above, only slot 0 has a backplane-mounted pull-down resistor R0. That is, if Controller Card 100 is plugged into any slot other than slot 0, then pull-down resistor R0 will be absent, there will be no voltage division, and the voltage developed at the card-detection connector pin will be a high logic level signal.

Figure 2:
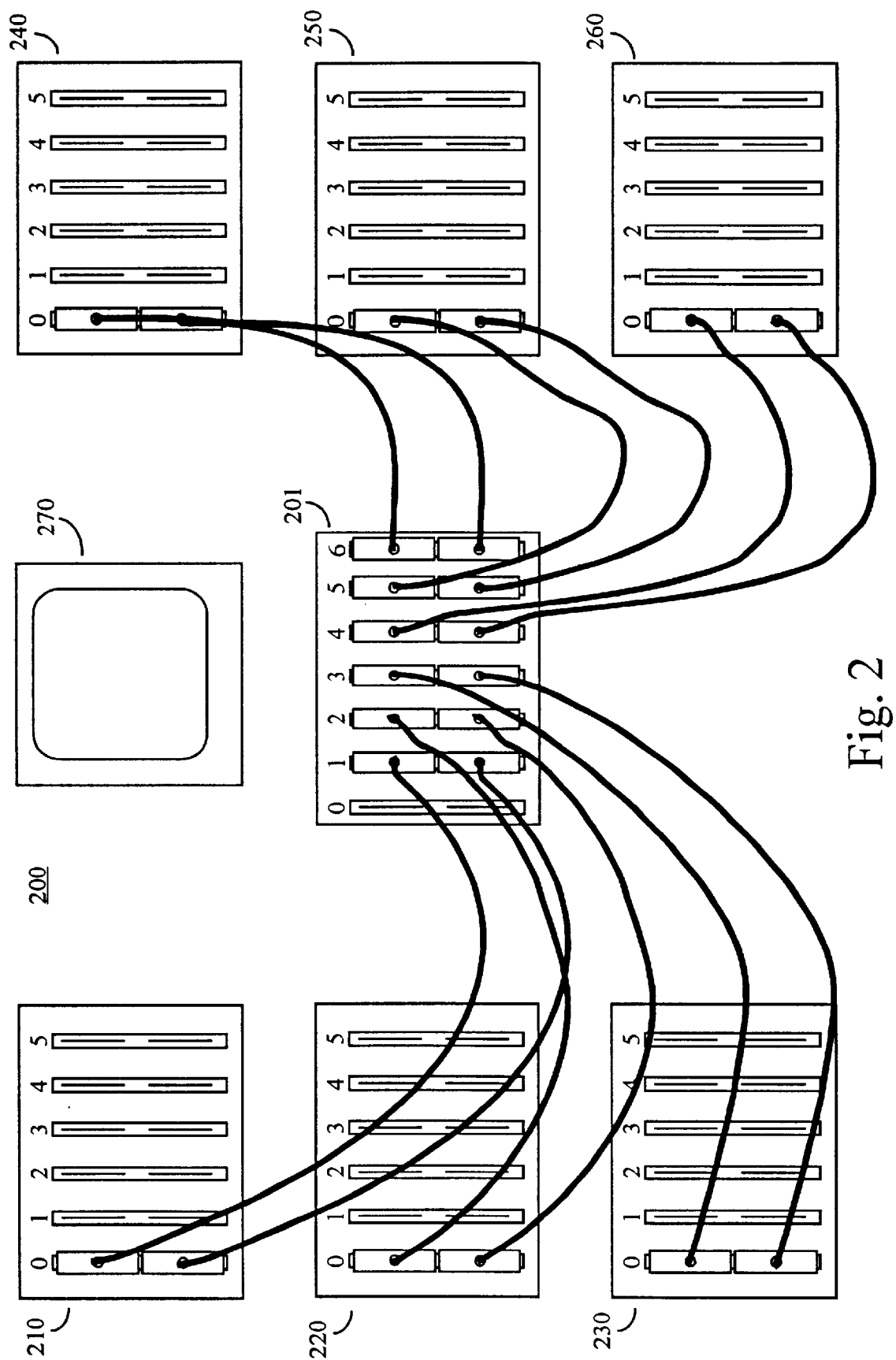
FIG. 2 shows a system having six expansion chassis suitable for use with the invention.

Controller Card 100 can also determine if other slots are occupied. Each non-controller board is required by the VXI standard specification to provide a pull-down resistor R0', R0" of a predetermined value. This pull-down resistor is coupled between the card detection connector pin on its own circuit card and ground. Slot 1 in FIG. 2 is occupied, therefore resistor R0' on the circuit card installed in slot 1 will develop a low logic level signal at its slot-detection connector pin (i.e., the junction of its pull-down resistor R0' and its respective pull-up resistor RB on Controller Card 100. When Controller 101 senses a low logic-level signal at that particular connector pin, then Controller 101 recognizes the presence of a circuit card in slot 1. The circuitry for detecting the presence of a circuit board in slot 3 functions in the same manner and need not be described again.

Note that slot 2 is unoccupied. Remember that a non-zero slot is dependent upon a Non-Controller Circuit Card for providing a pull down resistor for that slot. Thus, the pull-down resistor for slot 2 is absent, no voltage division will take place with respect to pull-up resistor RC, and a high logic-level signal will be developed at that particular connector pin. From this high logic-level signal, Controller 101 will correctly determine that slot 0 is unoccupied.

From the foregoing, the following rules are apparent. First a slot zero card must pull up its own card detection connector pin. Second, a slot zero card must apply a high logic-level pull-up to the card-detection connector pins of all other slots. Third, a non-slot zero card must pull down its own card-detection connector pin. Note that while the circuits of pull-up resistors RA, RB, RC, and RD are shown as being connected to non-varying voltage source +V, they are in fact, connected to active circuits (not shown for simplicity). These active circuits may provide signals at different logic levels at some short time after power-up. Thus, a meaningful determination of slot 0 position and non-slot 0 card presence can only be made for the short time before these active circuits become operational, because the signals at the junction points of the voltage dividers will be over-ridden by signals corresponding to other functions.

A VXI multi-chassis system is illustrated in FIG. 2. One VXI Chassis 201 is the configured to be the primary chassis in the system. Chassis 210, 220, 230, 240, 250, and 260 are secondary chassis. A system monitor 270 is included for completeness but does not directly concern the subject invention. It is important to note that in every case, the data bus expansion arrangement is plugged into slot 0 on the expansion chassis side, and is plugged into any slot other than slot 0 (i.e., $\overline{slot0}$) on the primary chassis side. Thus, the circuit card at one end of each cable shown in FIG. 2 will be plugged into slot 0 and must conform to the slot 0 rules. Whereas, the circuit card at the other end of the cable will be plugged into a slot other than slot 0 and must conform to the non-slot 0 rules. One can now see the problems encountered when one tries to make such a bus expansion cable assembly symmetric and reversible.

Figure 3:
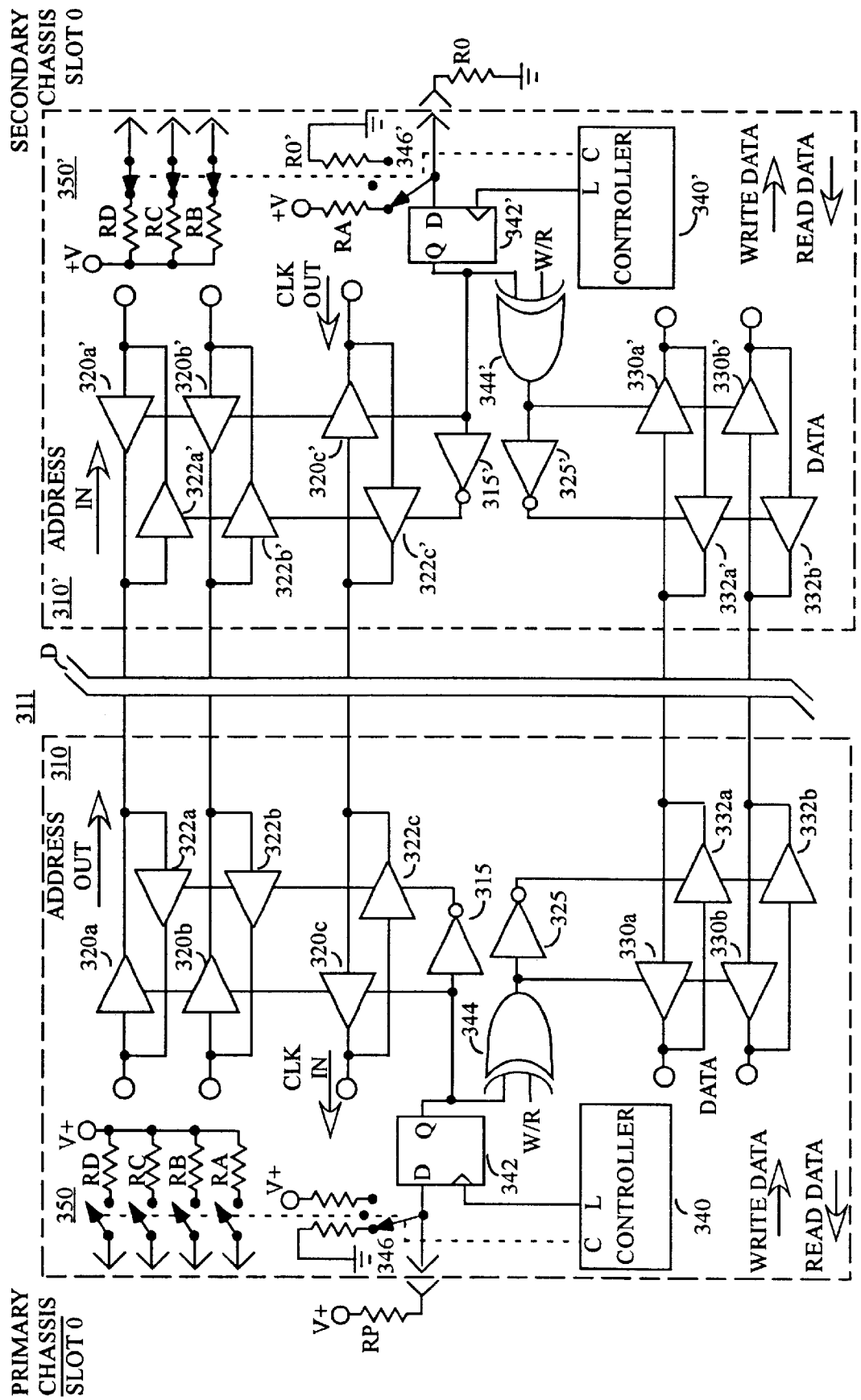
FIG. 3 shows a data bus expansion arrangement in accordance with the invention.

The solution to this dilemma is shown in FIG. 3. FIG. 3 is an illustration of an apparatus for data bus expansion between two instrument chassis. The apparatus includes a first Interface Card, generally designated 310, a Connecting Cable 311, and a second Interface Card, generally designated 310'. It is important to note that the Interface Cards are identical and interchangeable. Moreover, the entire assembly of Interface Cards 310, 310' and Connecting Cable 311 can be swapped end-for-end and will continue function in a correct and normal manner.

For simplicity, the address bus is represented by only two address lines, the data bus is represented by only two data lines, and only one other signal, a clock line, is shown. One skilled in the art will immediately realize that the address and data lines may be, for example, 32 or 64 bits wide, and that other signals identified by the VXI standard specification may be necessary for proper operation. Such other signals are not shown because they do not directly relate to the subject invention.

As noted above with respect to FIG. 1, a Controller Card has a predetermined role to play in the system; it needs only to ensure that it is correctly placed in slot 0 before assuming its duties. In contrast, Interface Card 310 of FIG. 3 must detect its slot position, which slot position determines its role, as will be explained below.

An address bus is coupled between Interface Card 310 and Interface Card 310' by a Cable (or transmission line) 311 (having a length D, which may be, but is not limited to, four feet (121 cm)). Direction of signal flow on the address bus should be from primary unit side to expansion unit side. Clearly, each Interface Card must make a determination as to whether it is a primary side device or an expansion side device. Detection circuitry on each Interface Card detects slot position, and slot position determines direction of address and data flow for each card. That is, bus interface circuitry for address and data are reconfigured in accordance with slot determination.

Because Interface Cards 310 and 310' are identical, there is no need to describe both of them in detail. Elements of the two Interface Cards having similar reference numerals perform identical functions. Direction of the flow of address information on each of the two illustrated address lines is managed by a pair of tristate buffers 320a, 322a and 320b, 322b connected in an anti-parallel configuration. When buffers 320a and 320b are active, buffers 322a and 322b are disabled.

Direction of the flow of clock information on the illustrated clock line is managed by a pair of tristate buffers 320c, 322c connected in an anti-parallel configuration. When buffer 320c is active, buffer 322c is disabled. An Inverter 315 generates a complementary control signal with respect to the control signal at its input to ensure this mutually exclusive operation.

Data flow is bi-directional, with direction at any particular time depending upon whether the data is associated with a read command or a write command. Direction of the flow of data on each of the two illustrated data lines is managed by a pair of tristate buffers 330a, 332a and 330b, 332b connected in an anti-parallel configuration. When buffers 330a and 330b are active, buffers 332a and 332b are disabled. An Inverter 325 generates a complementary control signal with respect to the control signal at its input to ensure this mutually exclusive operation.

For purposes of explanation, assume that Interface Card 310 is plugged into a non-zero slot in the Primary-side Chassis, and that Interface Card 310' is plugged into slot 0 in an expansion side chassis. When power is applied, the first task for each of Interface Cards 310, 310' is to determine whether it is plugged into a slot 0 location. Slot position detection circuitry including a Controller 340, a flip-flop 342, an Exclusive-OR gate 344, and a switch 346, accomplishes this task. An electronically-controllable switch 346 is illustrated as a three position electronically-controllable rotary switch for simplicity, and is controlled by a control signal generated by a Controller 340. At first, switch 346 is controlled to be in the open state. Because Interface Card 310 is plugged into a non-zero slot, the position detection pin is pulled up by a resistor RP (actually mounted on the controller card installed in slot 0 of the primary-side chassis. A high logic-level signal will be developed at the D input of flip-flop 342, and Controller 340 then generates a latch signal causing flip-flop 342 to latch the high logic-level signal present at its D input to its Q output. Thus, a signal determinative of non-zero slot position will be preserved even though continually varying signals will later be developed at that pin. Having determined that Interface Card 310 is occupying a non-zero slot, Controller 340 conforms to the appropriate VXI rule by causing switch 346 to connect a pull-down resistor to the position detection pin. The latched position-indicative signal developed at the Q output of flip-flop 342 determines the direction of address, clock and data flow as shown by the arrows on Interface Card 310.

An Exclusive-Or gate 344 receives a W/R (i.e., Write/Read) signal and the latched position-indicative signal and generates a control signal appropriate for steering the data direction for read and write signals.

Similarly, for Interface Card 310', slot position detection circuitry including a Controller 340', a flip-flop 342', an Exclusive-OR gate 344', and a switch 346', accomplishes this task. An electronically-controllable switch 346' is illustrated as a three position electronically-controllable rotary switch for simplicity, and is controlled by a control signal generated by a Controller 340'. At first, switch 346' is controlled to be in the open state. Because Interface Card 310' is plugged into slot 0 of an extension chassis, the position detection pin is pulled down by a resistor R0 (actually mounted on the backplane of slot 0 of the primary-side chassis. A low logic-level signal will be developed at the D input of flip-flop 342', and Controller 340' then generates a latch signal causing flip-flop 342' to latch the low logic-level signal present at its D input to its Q output. Thus, a signal determinative of slot 0 position will be preserved even though continually varying signals will later be developed at that pin. Having determined that Interface Card 310' is occupying slot 0, Controller 340' conforms to the appropriate VXI rule by causing switch 346' to connect a pull-up resistor to the position detection pin. The latched position-indicative signal developed at the Q output of flip-flop 342' determines the direction of address, clock and data flow as shown by the arrows on Interface Card 310'.

An Exclusive-Or gate 344' receives a W/R (i.e., Write/Read) signal and the latched position-indicative signal and generates a control signal appropriate for steering the data direction for read and write signals.

Recall that a slot 0 card has an obligation imposed on it to provide pull-up resistors for connection to the position detection pins on all of the other slots in its chassis. In this regard, Controller 340' will cause pull-up resistors RB, RC, and RD, to be coupled to the position detection pins of all other slots in its chassis.

What has been described is a symmetric, reversible, bus expansion apparatus that self-detects whether it is a slot 0 device or a non-zero slot device, and configures itself accordingly. Advantageously, a user can swap the Interface Card and Cable arrangement end-for-end without causing any adverse consequences.

What is claimed is:

1. An expanded address and data bus arrangement, comprising:
    a first interface circuit coupled to a first chassis having a plurality of slot positions for receiving circuit cards;
    a second interface circuit coupled to a second chassis having a plurality of slot positions for receiving circuit cards; and
    a transmission line coupled between said first and second interface circuits;
    said first interface circuit having detection circuitry for detecting its slot position and configuring its circuitry and direction of signal flow accordingly;
    said second interface circuit having detection circuitry for detecting its slot position and configuring its circuitry and direction of signal flow accordingly;
    said first and second interface circuits being substantially identical.

2. The expanded address and data bus arrangement of claim 1, wherein:
    said detection circuitry detects an external signal from which slot position information can be derived.

3. The expanded address and data bus arrangement of claim 2, wherein:
    said first interface circuit configures itself as a VXI slot 0 device or a VXI non-slot 0 device in response to a determination of which slot of a VXI chassis it occupies.

4. An expanded address and data bus arrangement, comprising:
    a first interface circuit coupled to a first chassis having a plurality of slot positions for receiving circuit cards;
    a second interface circuit coupled to a second chassis having a plurality of slot positions for receiving circuit cards; and
    a cable coupled between said first and second interface circuits;
    said first interface circuit having detection circuitry for detecting its slot position and configuring its circuitry and direction of signal flow accordingly;
    said second interface circuit having detection circuitry for detecting its slot position and configuring its circuitry and direction of signal flow accordingly;
    said first interface circuit, said cable, and said second interface circuit being coupled in that order to form an assembly, said assembly being symmetric and reversible.

5. The expanded address and data bus arrangement of claim 4, wherein:
    said detection circuitry detects an external signal from which slot position information can be derived.

6. The expanded address and data bus arrangement of claim 5, wherein:
    said first interface circuit configures itself as a VXI slot 0 device or a VXI non-slot 0 device in response to a determination of which slot of a VXI chassis it occupies.

* * * * *